(12) United States Patent
Gu

(10) Patent No.: US 6,901,126 B1
(45) Date of Patent: May 31, 2005

(54) TIME DIVISION MULTIPLEX DATA RECOVERY SYSTEM USING CLOSE LOOP PHASE AND DELAY LOCKED LOOP

(75) Inventor: Richard Gu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 607 days.

(21) Appl. No.: 09/607,772

(22) Filed: Jun. 30, 2000

(51) Int. Cl.[7] ............................. H04L 7/00; H03D 3/24
(52) U.S. Cl. ..................... 375/355; 375/376; 375/354; 375/373
(58) Field of Search ........................ 375/354, 355, 375/371, 373, 376, 130, 219; 331/50; 326/93

(56) References Cited

U.S. PATENT DOCUMENTS

| | | | | |
|---|---|---|---|---|
| 5,740,213 A | * | 4/1998 | Dreyer | 375/374 |
| 5,828,250 A | * | 10/1998 | Konno | 327/116 |
| 5,907,253 A | * | 5/1999 | Davis et al. | 327/156 |
| 6,011,732 A | * | 1/2000 | Harrison et al. | 365/194 |
| 6,035,409 A | * | 3/2000 | Gaudet | 713/401 |
| 6,285,726 B1 | * | 9/2001 | Gaudet | 375/376 |

* cited by examiner

Primary Examiner—Stephen Chin
Assistant Examiner—Jason M. Perilla
(74) Attorney, Agent, or Firm—Robert D. Marshall, Jr.; W. James Brady, III; Frederick J. Telecky, Jr.

(57) ABSTRACT

A time division multiplex data recovery system using a closed-loop phase lock loop (PLL) and delay locked loop (DLL) is disclosed. In other words, one closed loop comprises both a phase locked loop (PLL) and a delay locked loop (DLL) in a novel time division multiplex data recovery system. This new architecture comprises a 4 stage Voltage Controlled Oscillator (VCO) used to generate 8 clock signals, 45 degrees phase shifted from one another, for 8 receivers to do the oversampling. An interpolator tracks the received data signal and feeds it back to the Phase/Frequency Detector (PFD). The PFD has a second input of the reference clock which the PFD uses along with the interpolator input to correct the frequency of the PLL. The PLL operates at a high bandwidth. The DLL's bandwidth is several orders lower than the PLL. The DLL activates only a multiplexer and an interpolator continuously, thereby drawing a minimum amount of power.

2 Claims, 10 Drawing Sheets

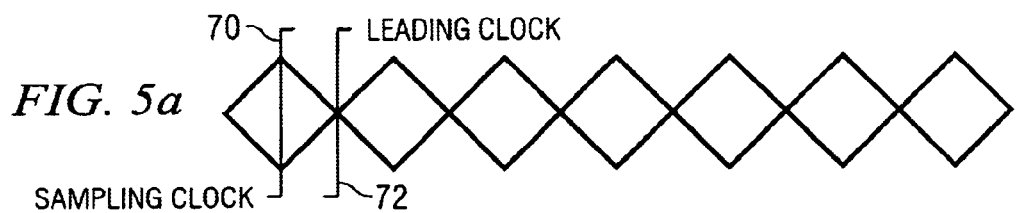
*FIG. 5a*
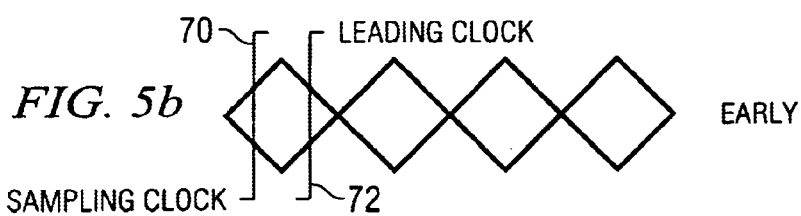
*FIG. 5b*
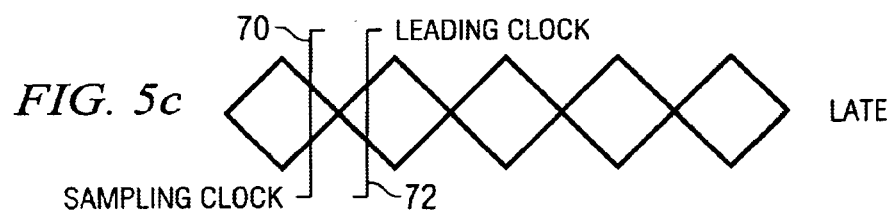
*FIG. 5c*
*FIG. 6*
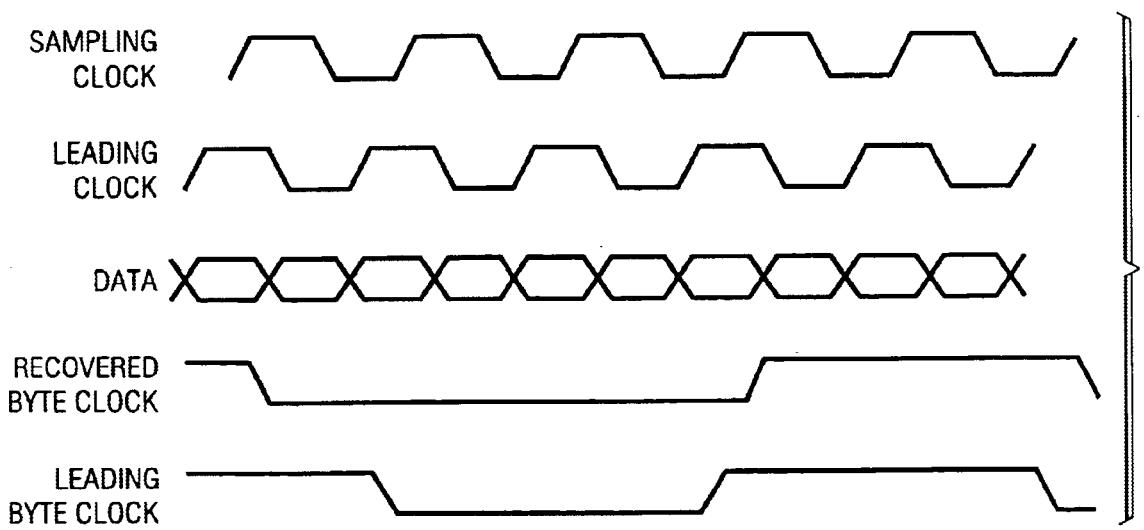

TIME DIVISION MULTIPLEX DATA RECOVERY SYSTEM USING CLOSE LOOP PHASE AND DELAY LOCKED LOOP

FIELD OF THE INVENTION

This invention relates in general to time division multiplex data recovery systems and more specifically to a time division multiplex data recovery system using a close loop phase and delay locked loop.

BACKGROUND OF THE INVENTION

The TI Wizard is a full Duplex SERDES (Serialize-Deserialize) function plus the high speed differential I/O, the built-in self test (BIST) circuitry, and the phase locked loop (PLL) and delay locked loop (DLL) circuitry needed for timing references for the SERDES. A Wizard port supports data rates from 1.0 Gbaud through 2.5 Gbaud. It also includes comma detect circuitry used for the byte alignment of incoming bit stream.

The Wizard performs basically a Fibre Channel operation: Transmit is 10-bits of 8b/10b encoded data in and 1 bit at 10× the frequency differential out Receive is a 10× speed serial bit stream in and 10-bit 8b/10b data out. The receive side also performs byte alignment. Wizard is also intended to be used as the Physical Interface Portion of the 800 Mb 1394 standard, as well as Gigabit Ethernet, board to Board interconnect, DSP test port interface, chip to chip interconnect, and any application that requires a very high speed serial interface. The primary intended application for Wizard is to provide building blocks in the ASIC library for developing point-to-point baseband data transmission over controlled impedance media of approximately 5052. The transmission media can be printed circuit boards, copper cables or fiber-optical media. The ultimate rate and distance of data transfer is dependent upon the attenuation characteristics of the media and the noise coupling to the environment.

A Wizard port performs the data serialization, deserialization, and clock extraction functions for a physical layer interface device. The transceiver operates at a maximum of 2.5 Gbps of bandwidth over a serial interface. The transmitter portion serializes 10-bit data words at a rate based on the supplied reference clock. The 10-bit word is intended for 8b/10b encoded data, which is then serialized and transmitted differentially at the intended data rate using Non-Return-to-Zero (NRZ). The receive section deserializes the input data and synchronizes the 10-bit wide bus data to the local reference clock.

As shown in FIG. 1, a phase locked loop (PLL) is used for clock multiplication and a delay locked loop (DLL) is used for clock recovery. The speed of the reference clock (REFCLK) of the PLL is 100–250 MHz depending upon the ASIC or board speed of the data link. Transmit path registers the parallel data TD<0:9> at the rising edge of REFCLK, does the parallel to serial conversion and sends the serial data through the transmitter at both edges of the TX clock. Receive path receives serial data and does serial to parallel conversion using the RX clock.

One prior art structure of a time division multiplex data recovery system uses one PLL as the reference clock and two open-loop DLLs for data recovery. Although this system has the advantage of being stable in a noisy environment due to the high bandwidth of the PILL and passive DLL clock recovery, this system also has the great disadvantage of requiring high power due to use of the high speed clock which necessitates a huge clock buffer and additional digital logic processing the output of the receiver. Also disadvantageous is that the majority of the system operates digitally thus increasing the power required as the frequency of operation increases.

A second prior art system uses a single PLL for data recovery. Although this system has the advantages of operating at high speeds due to the time division multiplex of 20 slow clocks(assuming a 1:10 deserializer), low power operation due to no clock buffer requirement (clock fanout is one, i.e. capacitive load is very small) and few digital circuits in operation, and activity of all the transmitter and receivers is at a 10% duty cycle due to the time division multiplex, it also has the disadvantage of the data loop receiver having large hunting jitter and the system is not stable in noisy environments due to the extremely narrow bandwidth of operation.

SUMMARY OF THE INVENTION

A time division multiplex data recovery system using a closed-loop phase locked loop (PLL) and a delay locked loop (DLL). In other words, one closed loop comprises both a phase locked loop (PLL) and a delay locked loop (DLL) in a novel time division multiplex data recovery system. This new architecture comprises a 4 stage Voltage Controlled Oscillator (VCO) used to generate 8 clock signals, 45 degrees phase shifted from one another, for 8 receivers to do the oversampling in the data recovery block. The receivers 44 each trigger on only the rising edge of the clock to alleviate duty cycle issues. A phase interpolator 44 tracks the received data signal and feeds it back to the Phase/Frequency Detector (PFD) 34 to adjust the measurement position of the sampling clock 70. The PFD 34 has a second input of the reference clock which the PFD uses along with the interpolator input to correct the frequency and phase of the PLL. The PLL operates at a high bandwidth. The DLL's bandwidth is several orders lower than the PLL. The DLL activates only a multiplexer and an interpolator continuously, thereby drawing a minimum amount of power.

BRIEF DESCRIPTION OF THE DRAWING

FIG. 5 illustrates an eye diagram of the data recovered by the receivers 41 illustrated in the VCO 38 of FIG. 4(although in actuality, the receivers 41 are located in the data recovery block 40 of FIG. 3).

FIG. 6 illustrates the relationship between the sampling clock, the leading clock, the input data, and recovered byte clock and leading byte clock waveforms of the Early/Late Voting logic of the data recovery block of FIG. 3.

DETAILED DESCRIPTION OF THE PREFERRED EMBODIMENTS

Figure 1:
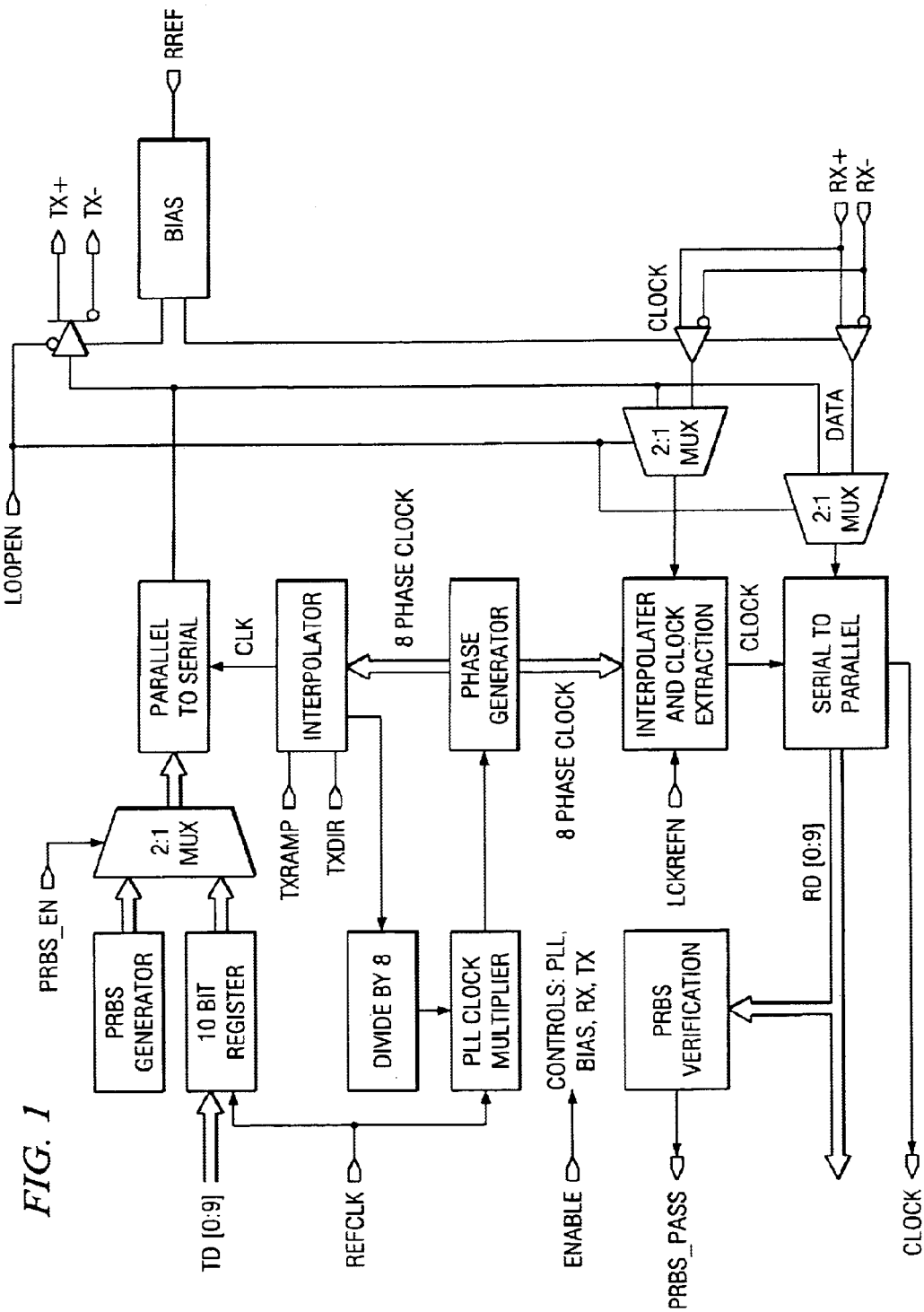
FIG. 1 illustrates a block diagram of the TI Wizard full Duplex SERDES (Serialize-Deserialize) function.
Figure 2:
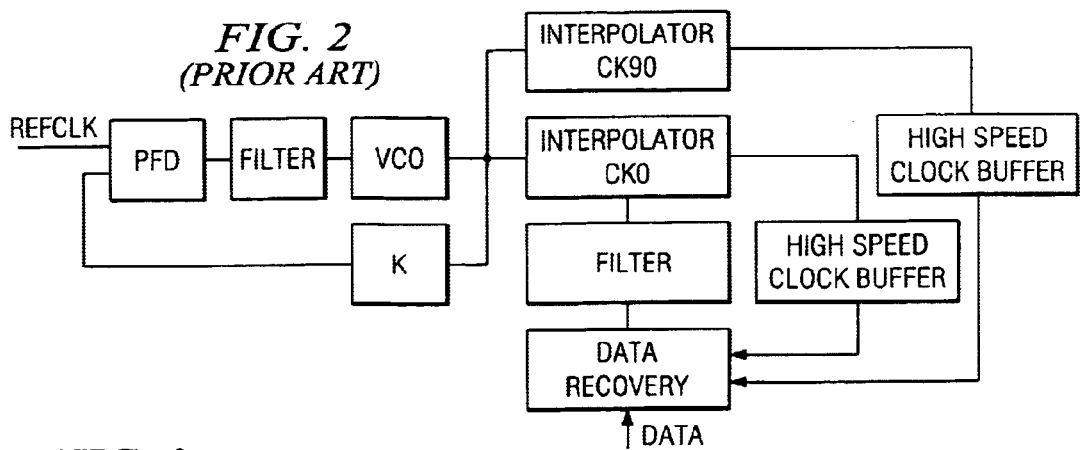
FIG. 2 illustrates a block diagram of a time division multiplex data recovery system of the prior art.

Architecturally, the transceiver uses a conventional PLL 30 frequency synthesizer on the Transmit side to generate high speed timing references. But on the receive side, according to a preferred embodiment of the invention, it uses an interpolator 44 and a bimodal data/clock receiver 40,41, 42 to determine the ideal placement of the theoretical recovered clock. The phase select circuit 42 and phase interpolator 44 then picks one of the many, i.e. 8, phases of the Delay Locked Loop (DLL) 32 (driven by the Transmit PLL 30) that best matches the ideal and uses it as the recovered clock. This process continuously repeats itself as the incoming frequency is slightly off-frequency from the reference frequency.

The Phase Locked Loop (PLL) 30 design consists of a phase/frequency detector 34, a differential charge pump, an on chip loop filter capacitor 36, a replica-feedback current source bias, a differential voltage controlled oscillator (VCO) 38, differential to single end buffer stages and a divide by five circuit block 46. The PLL 30 operates at 1.25 GHz, worst case, and minimizes the clock jitter caused by 250 MHz with 250 mV of low frequency square wave supply noise.

There are two important parameters in a Phase Locked Loop (PLL) 30 design. They are the damping factor and the loop bandwidth. The damping factor can be simplified as:

$$\zeta = \frac{y}{4}\sqrt{\frac{x_i}{N}}\sqrt{\frac{C_1^2}{C_B(C_1+C_2)}}$$

where: y is the ratio of the small signal resistance of loop filter resistance of symmetric load in the delay element in the Voltage Controlled Oscillator (VCO), x is the ratio of charge pump current to the bias current set in the delay element of the VCO, N is the VCO frequency multiplier, $C_1$ is loop filter capacitance, $C_B$ is the total effective capacitance of VCO ring oscillator and $C_2$ is the third order-roll off capacitance. The loop bandwidth to operating frequency ratio is given by $$\frac{\omega_m}{\omega_{REF}} = \frac{xN}{2\pi}\sqrt{\frac{C_B}{C_1}}$$

In the transceiver PILL 30 design, y=3, x=0.5, N=5, $C_1$=12 pf, $C_b$=0.372 pf, $C_2$=0.6 pf.

Figure 3:
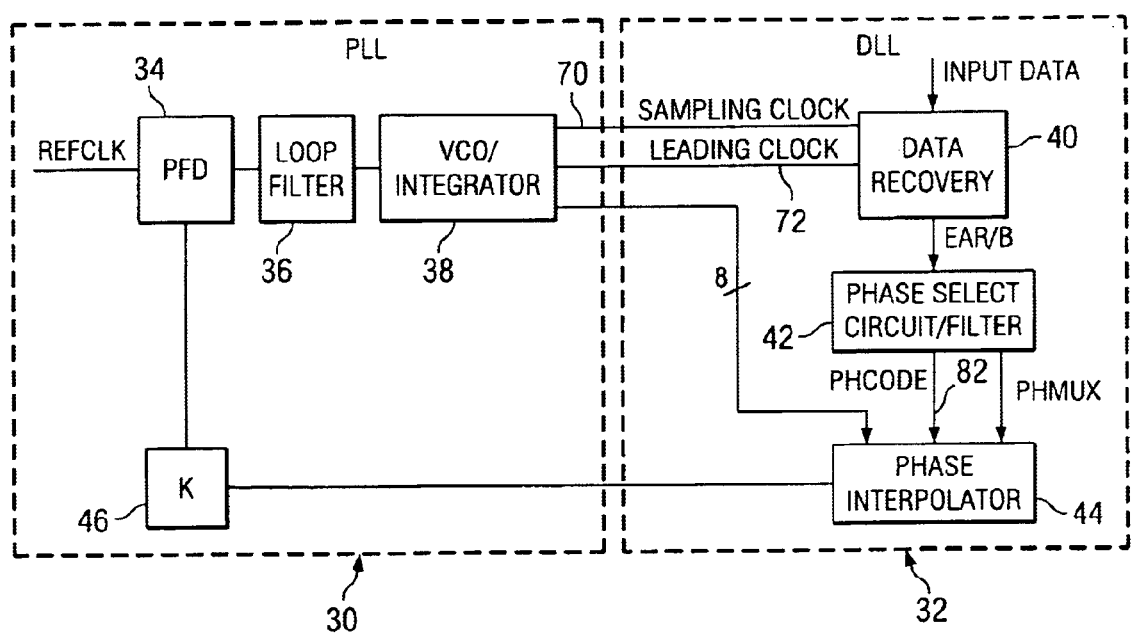
FIG. 3 illustrates a block diagram of a time division multiplex data recovery system using a closed-loop phase lock loop(PLL) 30 and delay locked loop(DLL) 32 according to a preferred embodiment of the invention.

As seen from left to right in FIG. 3, the Phase Frequency Comparator (PFD) 34 will assert equal and short duration pulses at the outputs when both inputs are in phase. These pulses will help eliminate a dead-band in phase to frequency conversion which will lead to additional input tracking jitter. Since the outputs of PFD 34 (UP and DN) are single ended signals, these two signals are converted into differential UPs and DNs signals by the Phase Splitter Buffer or the INV 32 blocks, which are included in the PFD 34 of FIG. 3. INV 32 blocks generate two differential UPs and two differential DNs to drive two differential charge pumps. The differential UPs and DNs signal from the output of the INV 32 blocks should be matched as close as possible to help achieve zero static phase offset in the differential charge pump. The differential charge pump circuit, included in the loop filter block of FIG. 3, is composed of three identical differential pair stages. The two differential input stages reduce noise coupling from full swing UPs and DNs signals to nearly DC signal at the charge pump output. The output differential pair sums the "phase-to-current conversion" currents at the loop filter node. Each differential pair consists of symmetric loads, two NMOS source coupled pair and NMOS current source which is driven by the current replica circuit output Vcn. Since the PLL 30 is capable of operating over a wide range of frequency and the differential charge pump is scaled inversely proportional with the operating frequency, the differential charge pump current is set high (i.e. ~250 µa) at 2.6 Gbps operating frequency so that it does not go below 10 µa when the operating frequency is low.

Loop filter 36 components consist of resistors and capacitors (third order loop) forming a low pass filter and are all on chip components. Capacitors are N-well PMOS devices with gate connected to control voltage node and drain, source and backgate connect to power supply. In a noisy substrate environment, Nwell device is preferred for a noise sensitive circuit. The loop filter capacitor is 12 pf and the third order roll-off capacitor is set approximately to 0.6 pf(equal to 12 pf/20). The third order capacitor is used to help reduce high frequency ripple on the control voltage Vcp. The total capacitance of the third order capacitor should be less than the loop filter capacitor divided by 20 which is limited by the phase margin constraint.

The replica feedback bias circuit, located in the loop filter 36 of FIG. 3, is used to generate Vcp and Vcn from the loop filter voltage Vctrl for application to the VCO 38 and the phase interpolator 44. There are two replica-feedback bias circuit blocks. One is used in the core PLL 30 (to bias the VCO 38) and the other is used for biasing the phase interpolators 44 of the transmitters and receivers. This scheme helps to keep the closed loop bandwidth of both replica feedback bias circuits high so that they can track power and substrate noises that can effect the PLL 30 jitter performance. Each replica feedback bias circuit consists of an amplifier bias, a common source PMOS differential amplifier, a half buffer replica circuit and a loop filter control Vctrl voltage buffer. The transistors in loop filter 36 control Vctrl voltage buffers are adjusted so that 1/gm of the PMOS transistors is the desired feed-forward zero resistor value. Since the replica-feedback circuits are self-biasing circuits, bias start up circuit is essential to jump start the replica-feedback bias circuits which in turn initialize the PLL circuit properly.

Figure 4:
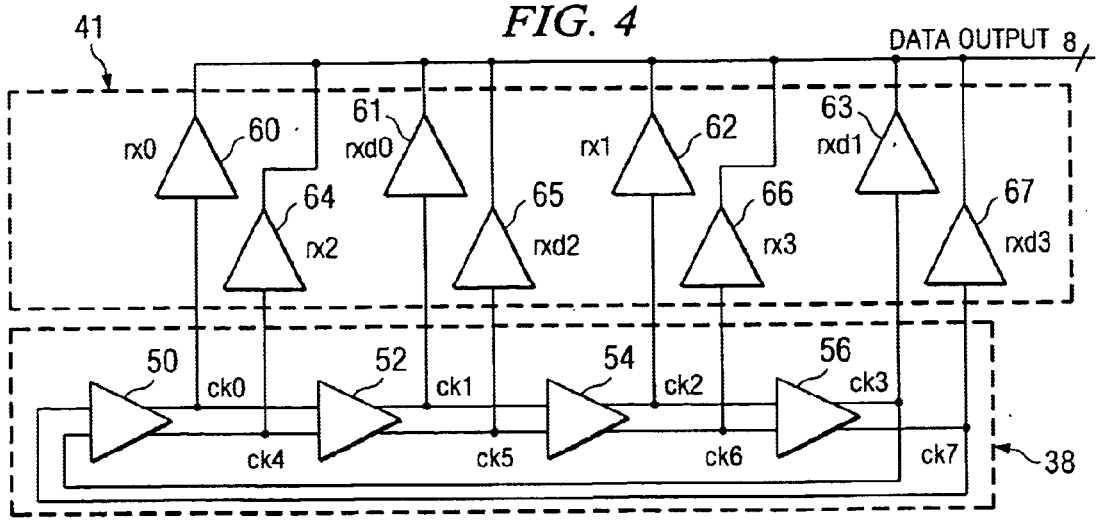
FIG. 4 illustrates a block diagram of the VCO 38 of the PLL 30 according to a preferred embodiment of the invention.

The core of the VCO 38 consists of 4 differential delay elements 50, 52, 54 and 56 connected in a ring (FIG. 4). The differential output at each node in the ring is buffered by three more stages of delay element at 1×, 2×, and 3× of the core delay element buffer strength. Each differential delay element consists of an NMOS source coupled pair, a current source NMOS bias by Vcn and a pair symmetric load. Each symmetric load consists of a diode-connected PMOS device in shunt with an equally sized Vcp biased PMOS device.

The 8 differential signal outputs from the VCO are converted into 8 phase distinct inputs, separated by 45 degrees, to directly drive the eight receivers 41 of the data recovery block 40. This is unlike the prior systems which use high speed clock buffers driving the receivers 41. The 8 phase distinct inputs also form inputs to the phase interpolator 44. The bandwidth of this buffer should be high so that the fastest start up oscillation frequency of the VCO in the strong process corner still can pass through this buffer to close the feedback loop. A divide by 5 circuit 46 is used to divide the frequency of the signal at the output of the phase interpolator buffer 44. The final signal is then buffered and looped back to the PFD 34 in a closed loop to provide clock phase information feedback to the VCO 38 In this way, if the feedback clock is late, the charge pump in the PLL 30 will charge the PLL 30 clock faster to move the feedback clock to align with the reference clock. As the charge pump charges the PLL 30 and shifts the phase of the clock of the VCO 38, all 8 outputs of the VCO 38 will shift in parallel and will shift likewise, in the same amount and in the same direction.

The differential sampling receiver 41 design, illustrated in block diagram form in the VCO 38 of FIG. 4 operates at 1.25 Gbs and is driven by the 8 phase shifted clock signals generated by the VCO 38. The data recovery portion DLL of the loop of the time division multiplex data recovery system according to a preferred embodiment of the invention, starts with a sampling receiver 41. This system uses a single edge clocking scheme so there are four sampling receivers rx0 60, rx1 62, rx2 64 and rx3 66, called data receivers to recover the data from the input data stream—two for the odd bits and two for the even bits. There are also four more sampling receivers, rxd0 61, rxd1 63, rxd2 65 and rxd3 67, used to extract the phase information to be used, along with the extracted data information, to tune the sampling data triggering edge such that it is triggering in the middle of the data eye when the receive portion of the loop is in lock. Each one of the 8 receivers 41 are driven by one of the 8 phase shifted by 45 degrees signals from the VCO 38. The data output from the receivers 41, through the aid of additional circuitry, attains CMOS levels.

The early/late voting logic, illustrated in FIG. 8 through FIG. 11 or more comprehensively FIG. 5 through FIG. 11, is present in the data recovery block 40 of FIG. 3. The purpose of the early/late voting logic is to determine whether the high speed sample clock of the receiver 41 is early or late relative to the 'ideal' temporal position of the sampling clock. The high speed clock that is used to sample the deserialized data stream will be referred to as the "sampling clock" 70. The high speed clock that leads the sampling clock by 90 degrees will be referred to as the 'leading clock' 72. The ideal placement of the sampling point would be such that the high speed data is sampled right in the middle of the data bit's eye opening as illustrated in FIG. 5a where the sampling clock 70 is located. The early/late voting logic uses a high speed clock that leads the high speed sampling clock by 90 degrees, so that the high speed data sampled by this leading clock 72 would be sampled deliberately right in the middle of the data crossings in the eye diagram as illustrated in FIG. 5. This data, sampled by the leading clock 72, is compared to the data sampled by the sampling clock 70 to determine whether the sampling clock is early or late. The output of the early/late voting logic controls the phase select logic circuitry 42. The phase interpolator 44, early/late voting logic and phase select logic circuitry 42 all comprise a delay locked loop 32.

The deserializer logic is clocked off of the sampling logic. The early/late voting logic is clocked off the voting clock. The deserializer divides down the sampling clock by 5 to derive the recovered byte clock. This byte clock is synchronous to the deserialized data byte, and the recovered byte clock is used to clock whatever logic uses the deserialized data byte, such as the comma detect logic or the PRBSVER logic. The early/late voting logic divides down the leading clock by 4 to derive a leading byte clock, and this byte clock is synchronous to the voting result of the early/late voting block. This leading byte clock is used to clock the phase select logic 42 that uses the voting result of the early/late voting block. This leading byte clock is used to clock the phase select logic 42 that uses the voting result of the early/late voting block. FIG. 6 illustrates the relationships between these clocks.

Figure 7:
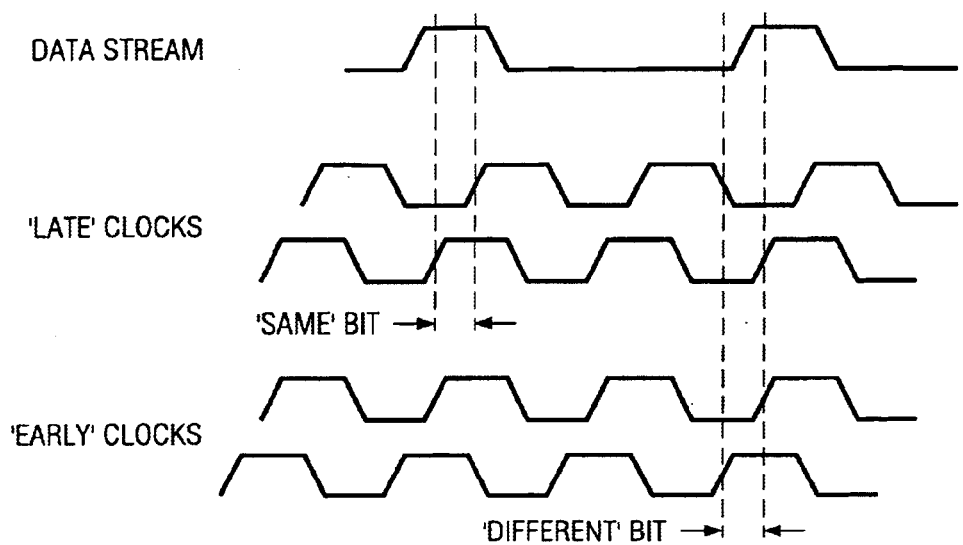
FIG. 7 illustrates a waveform diagram of the two data bits having an early/late comparison performed in the Early/Late voting logic of the data recovery block of FIG. 3.

The early/late voting logic is constructed in a pipelined fashion, two bits at a time. The input clock is the half-speed half baud rate clock, with rising edge leading the sampling clock 70 by 90 degrees. The first function is to determine from the data bits I whether the sampling clock 70 is early or late in the bit period as illustrated in FIGS. 5 and 7. Then these early or late indications are summed in pipelined fashion. This sum is accumulated over an 8-bit window. The early sum over an 8 bit window is compared to the sum of the late indications. If there are more early indications, then the early/late voting logic indicates an early vote. If there are more late indications, then the early/late voting logic indicates a late vote. The logic also derives a byte clock from the high speed clock by doing a divide by 4 (as earlier stated). The early/late voting result is output for every 8-bits of the data stream, and is provided synchronous to the early/late output byte clock.

The early/late voting logic first compares the two data bits to the corresponding data bits that were sampled with the sampling clock. This comparison determines whether the bit was sampled early or late. FIG. 7 illustrates the concept. Suppose for the moment that the data pattern is alternating 1's and 0's, with no jitter of the edges. If the sampling clock 70 is perfectly located in the middle of the bit, and the leading by 90 degree clock 72(hereafter called the voting clock 72) is truly leading by 90 degrees, then the voting clock 72 will deliberately be sampling the data bits during their transition. If the sampling clock 70 were to drift early in the bit time, then the voting clock 72 would also tend to drift early. If the voting clock 72 were early, then the voting clock 72 would actually be sampling the previous bit. In this case, an "XOR" of the two bits would reveal that the two bits were different, which would be taken as an indication of the clocks being early. If the sampling clock were to drift late into the bit time, then the voting logic would also tend to drift late. If the voting logic were late, then the voting clock would actually be sampling the same bit as the sampling clock. In this case, an XOR of the two bits would indicate that the bits were the same, which would also be taken as an indication of the clocks being late.

Figure 8:
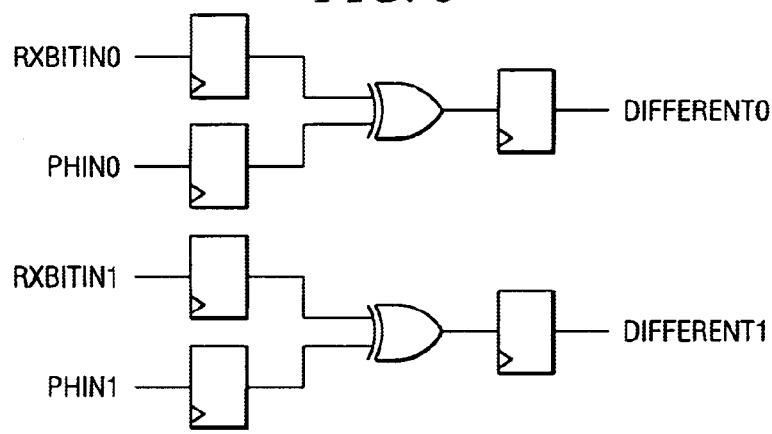
FIG. 8 illustrates the first stage of the early/late bit comparison pipeline of the Early/Late Voting logic of the data recovery block of FIG. 3.

FIG. 8 illustrates the first stage of the early/late pipeline, where the data bit sampled with the sampling clock 70 is compared to the data bit sampled with the leading clock 72. PHIN0 and PHIN1 are the data sampled by the leading 72 or voting clock 72, while RXBITIN0 and RXBITIN1 are the data sampled by the sampling clock 70. An XOR gate is all that is needed to do the compare. Because of the half-baud rate clocks, the pipeline compares two bits at a time.

Figure 9:
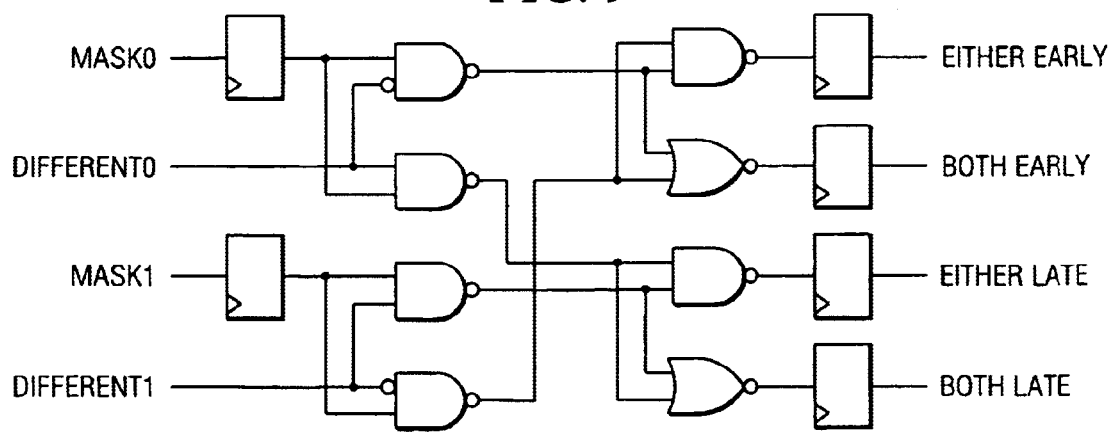
FIG. 9 illustrates the first stage of summing up the early and late votes of the Early/Late voting logic of the data recovery block of FIG. 3.

It should be noted that this early/late comparison is only valid if the stream has a logic transition from the current bit used for voting and the previous bit. If the data stream does not transition, then the comparison to the previous bit will indicate a 'late' result no matter whether the clocks were late or early because the bits will always be the same in the comparison. If the data stream had two '1s' in a row or two '0s' in a row, then a comparison of the two bits would always yield a 'same' result, even if the clocks were not 'late' in the baud interval. Thus, when there is not a data transition on the data stream, the voting logic must be inhibited. An XOR gate is needed to compare a data bit with the preceding data bit, and this signal is used to 'mask out' the early/late voting comparison. The mask comparison is done in the deserializer logic, and the mask signal is passed as an input to the early/late voting block. FIG. 9 illustrates the masking stage of the early/late pipeline. There will effectively be an additional vote besides an 'early' vote and a 'late' vote— there will also be a 'neither' vote. Thus, in every 8-bit window of summing votes, the sum of early votes and late votes will not total 8 unless there are data transitions within that 8-bit window of data.

Figure 10:
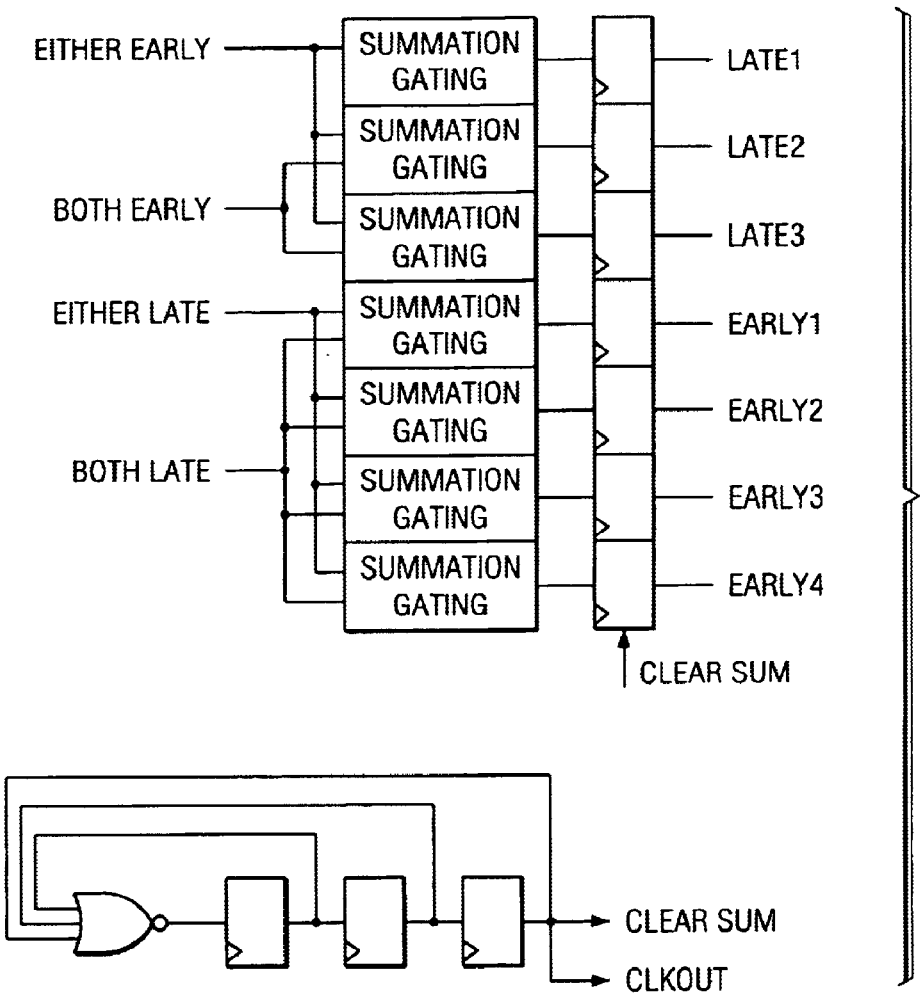
FIG. 10 illustrates the Early/Late accumulation stage of the Early/Late voting logic of the data recovery block of FIG. 3.

FIG. 10 also illustrates the first stage of summing up the early and late votes. In addition to gating the 'difference' comparison from FIG. 9 with the mask bit, the stage in FIG. 10 sums the votes (since we are working on two bits at a time) with what are essentially half adders. The output 'Either early' indicates that either one or the other of the two votes are 'early'. The output of 'Both early' indicates that both of the two votes are 'early'. The output of 'Either late' indicates that both of the two votes are 'late'. Because there may be less than two data transitions present, the sum of the 'either' and 'both' votes may not add up to two votes present. In fact, if there are no data transitions, all outputs from FIG. 9 will be inactive.

After the circuit of FIG. 9, the sum of early and late votes over a two-bit window of the data stream is available. The next stage is used to sum the votes over an 8-bit window of the data stream. This is done in the circuit loosely illustrated in FIG. 10. The outputs of FIG. 10 are summations of the outputs of FIG. 8. The output 'Late1' indicates that there was AT LEAST one late vote over the 8-bit window. The output 'Late2' indicates that there were at least two late votes over the 8-bit window. The rest of the outputs are named accordingly. It is only necessary to calculate vote accumulations for up to 3 or more 'Late' votes and up to 4 or more 'Early' votes. These 7 signals are enough to determine whether there are more late votes than early votes, or vice versa.

Each of the flip flops of FIG. 10 are essentially an accumulate and hold circuit. Any 'Either Late' vote will set the 'Late1' flip flop, and this value will be held. Also, any 'Both Late' indication will set the 'Late2' flip flop, directly. Any 'Either Late' vote when there already is a 'Late1' indication will set the 'Late2' flip flop, and this value will be held. Any 'Either Late' vote, when there already is a 'Late2' indication will set the 'Later flip flop. Thus, after 4 clock cycles the accumulator in FIG. 10 is reset to zero to start a new summation. This form of accumulation was chosen because it could be implemented in two stages of three-input logic, and is probably (along with the circuit of FIG. 11) the speed limitation of all the Wizard digital logic.

Figure 11:
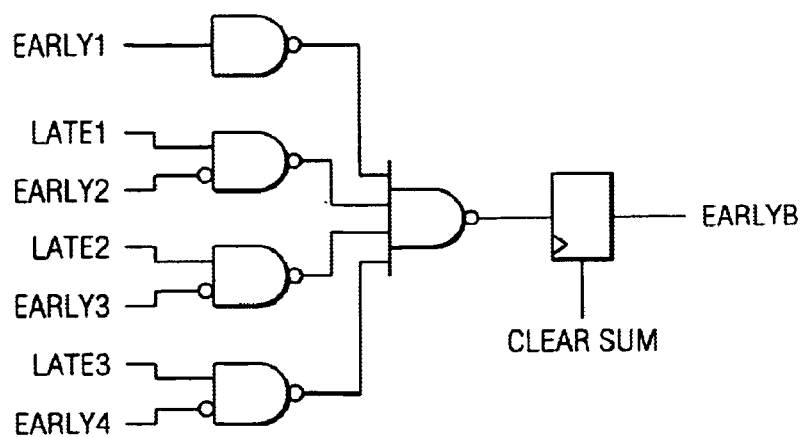
FIG. 11 illustrates the final stage of the Early/Late pipeline of the Early/Late voting logic of the data recovery block of FIG. 3.

FIG. 11 illustrates the final stage of the Early/Late pipeline. Given the outputs of FIG. 10, one can now determine whether there are more early votes, more late than early or the same number of early and late votes. If there is at least one late vote, and not two early votes, then the result is a majority of late votes. A one-to-one tie is taken as a late majority. Likewise, at least two late votes and not three early votes lead to a late majority and at least three late votes and not four early votes lead to a late majority. A two-to-two tie and a three-to-three tie are also taken as a late majority. All other cases are taken as an early majority. Thus, a zero-to-zero tie, and a four-to four tie are taken as an early majority.

The reason that a tie is not allowed is that the phase select logic that adjusts the phase of the high speed clocks must always adjust the phase one step earlier(if there is a late majority), or one step later (if there is an early majority). There is no provision for staying on the same phase step. Thus, a tie vote must be biased one way or the other. It was chosen that some tie votes would be taken as early, and the others taken as late to both minimize logic and to prevent the sample clock 70 from being systematically biased towards one side or the other of the ideal sampling point.

The comparison circuit of FIG. 11 uses the clear pulse that is generated every four clock cycles to multiplex between generating a new vote or holding the previous vote. This holds the early/late vote stable for a whole 8 bit time period so that the logic to follow has adequate set-up and hold provision between the EARLYB signal and the CLKOUT signal. The early/late voting output is defined such that a low signal indicates an early vote and a high signal indicates a not early, or late vote.

The logic of FIGS. 10. and 11 are among the most complex of the high speed digital logic. For this reason they were both implemented with a variant of pre-charged dynamic logic that maximizes the use of the faster n-channel transistors for the critical paths of the logic. This variant of dynamic logic is not dependent on the clock rate being above a certain rate, so there is no danger of charge bleeding off at slow or even near DC speeds.

Noteworthy is that the leading phase clock 72 is deliberately sampling the incoming data right at the ideal transition point. This is not normally the desired operation. The incoming data is being deliberately sampled right at the ideal data transition point. This is deliberately violating stable set-up and hold conditions on the flip flops that the data is being clocked into, leading to potentially unstable conditions. In reality, the data transitions will jitter around the ideal edge placement in practice so many times the data will be sampled accurately with the leading phase clock. On many other occasions this will not be so, however. The rationale is that on those occasions that the leading edge does catch the data right on transition, it does not matter whether the data was caught correctly or not. In this case, the metastable sampling of the data indicates that the leading edge clock is precisely positioned where it should be anyway. Since the phase select logic 42 MUST take a phase step early or late, either one will be a step away from ideal, and it does not matter which is chosen. It is expected that on the next phase update, the phase select logic 42 will step back towards the ideal sampling point again. Thus, there is a measure of built-in jitter on the recovered clock. The only remaining concern is that the early/late voting logic and the phase select logic 42 be implemented in such a way as to not get into an invalid or damaging state in the presence of metastable logic conditions internally. Due to the pipelined nature of the early/late voting logic, metastable logic conditions will not throw the logic into an invalid state and the depth of the pipelined logic actually helps to provide settling time for any metastable logic condition to settle down before it can propagate through to the phase select logic. The remaining concern is that the Phase Select Logic Block 42 can be constructed such that it is tolerant of potentially metastable conditions on the early/late voting result. That topic will be covered in the documentation for the phase select logic 42.

Looking at the bigger picture of the digital locked loop (DLL) 32, the time required to determine a vote, update the phase select logic 42, and let the phase interpolators 44 settle to a stable phase all determine the maximum update rate of the DLL 32. The maximum update rate of the DLL 32 effectively determines the DLL's 32 bandwidth and its ability to track frequency offset and wander. In the current implementation of the transceiver, the early/late vote takes about 18-bit times to calculate. Allowing 4-bit times for the phase select 42 update and 10-bit times for the phase interpolators 44 to settle, makes for a maximum phase update every 32 bit times. Since there are 64 phase steps per bit time, a maximum tracking rate of ⅟₃₂ times ⅟₆₄=⅟₂₀₄₈ or 488 parts per million is achieved.

The function of the Phase Select block 42 is to generate the digital control word that sets the phase of the recovered clock via the phase interpolator 44.The phase control word is a 19-bit digital word that selects one of 128 possible phases through the phase interpolators from the analog PLL 30. The 19 bit control word that selects one of 128 possible phases through the phase interpolators from the analog PLL. The 19-bit I control word comes from a bank of 19 flip flops that are operated as a form of state machine. The Phase Select state machine 42 is clocked from the recovered byte clock from the Early/Late Voting block, which is the high speed leading phase clock 72 divided by 4. On every clock rising edge, the phase control word is updated to point to the next earlier phase, next later phase, or remain on the same phase.

Figure 12:
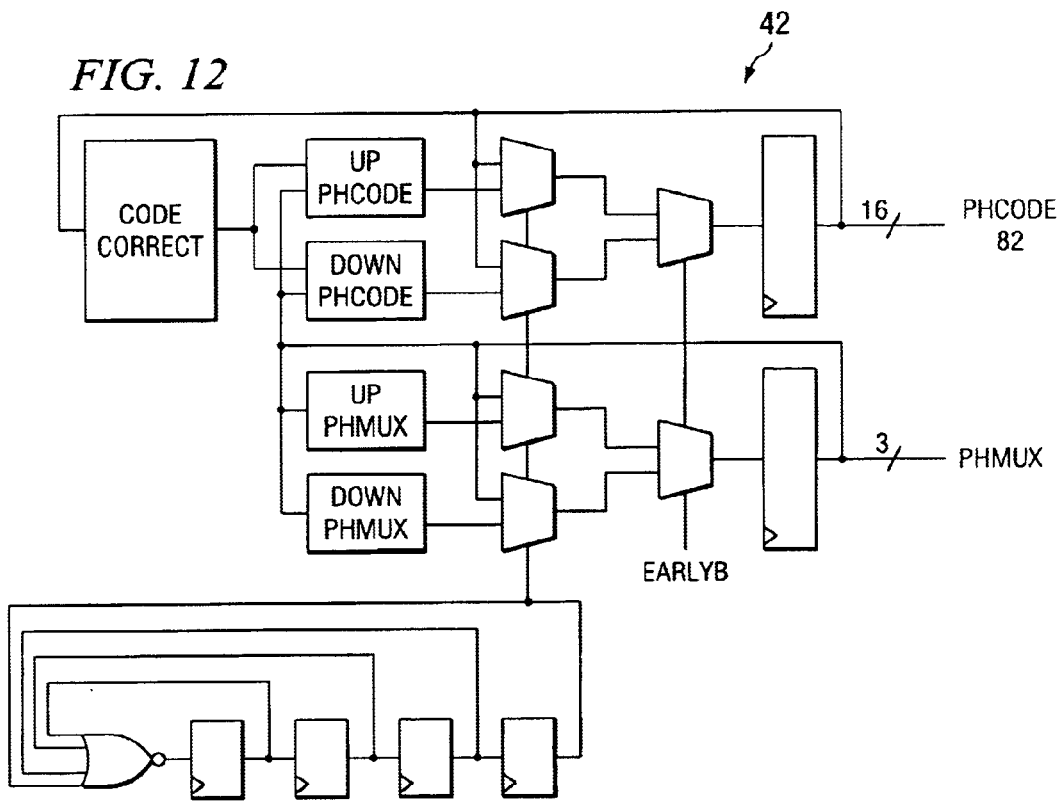
FIG. 12 illustrates a simplified phase select block diagram which illustrates the operation of the Phase interpolator 44 of FIG. 3.

FIG. 12 illustrates the operation of the state machine of Phase Select block 42. A bank of 16 flip flops contain a 16-bit 'thermometer code' 82 that controls the interpolation section of the phase interpolators 44. An additional three flip flops hold a 3 bit code that selects the multiplexing of the 8 clock phases into the phase interpolators 44. The total 19-bit register is operated as a state machine, where each state in the state machine determines the next state, depending upon the value of the EARLYB voting result from the Early/Late Voting block.

FIG. 12 shows a divide-by-4 circuit that divides down the input clock to derive a control pulse that goes to multiplexers in front of the flip flops. This is called the decimation circuit and makes certain that the phase state is NOT updated on three clock cycles out of every four. Every fourth clock cycle the phase state is updated to point to the next later state (called the 'up' state) or the next earlier state (called the 'down' state). The decimation ensures that the phase is only updated every 32-bits, giving the phase interpolators 44 time to settle out before the next early/late voting is taken.

On the clock cycle where the phase is updated, the only choices for the new phase is the 'up' phase or the 'down' phase, depending upon the state of the EARLYB input. The EARLYB input controls a multiplexer that selects the new state, with a high level selecting the down (earlier) state and a low level selecting the up (later) state. The 2-input multiplexers controlled by the EARLYB signal are placed closest to the state flip flops in order to minimize set-up/hold requirements on the EARLYB signal relative to the clock input. Fewer multiplexers would be needed if the multiplexers controlled by the decimation phase in FIG. 12 was placed closer to the flip flops, and the EARLYB signal then controlled one set of multiplexers that selected between up and down states, but the extra multipliers were deemed worthy for the purposes of keeping the EARLYB set-up/hold requirements down.

On each clock cycle of the state machine, the current phase state is fed back through the phase select logic 42 and both the next 'up' state and the next 'down' state are computed in parallel. Only one of the possible new states are used, depending on the control of the multiplexer, and the other possible new state is discarded and the current state is kept The 16-bit thermometer code 82 is used to select one of 17 possible phases between two input clocks. If the thermometer code 82 is 0000000000000000 then the resultant phase is 100% of the input clock and 0% of the second input clock. If the thermometer code 82 is 1000000000000000 then the resultant phase is −94% of the first input clock and −6% of the second input clock. If the thermometer code 82 is 1111111111111111 then the resultant phase is 0% of the first input clock and 100% of the second input clock. See FIG. 13 for illustration. At the code 1111111111111111, 0% of the first input clock is used to determine the resultant phase, and so at this code the mux input to the phase interpolator may by switched over to a third input clock with no change in the resultant phase. If the thermometer code 82 then becomes 1111111111111110, then the resultant phase is 94% of the second input clock and 6% of the third input clock. Thus the name thermometer code 82: the code rises from 0000000000000000 to 1111111111111111 as the phase interpolator is bumped 'up' in phase until the muxes for the input phases are switched, and then the thermometer code 82 falls from 1111111111111111 down to 0000000000000000 as the phase continues to be bumped 'up'. thus in even numbered octants of the phase diagram (see FIG. 14), a rising thermometer code 82 equates to moving 'up' in phase, while in odd numbered octants, a failing thermometer code 82 equates to moving 'down' in phase. This thermometer code is forwarded to the phase interpolator 44 for adjusting the phase of the sampling clock 70 accordingly.

Figure 14:
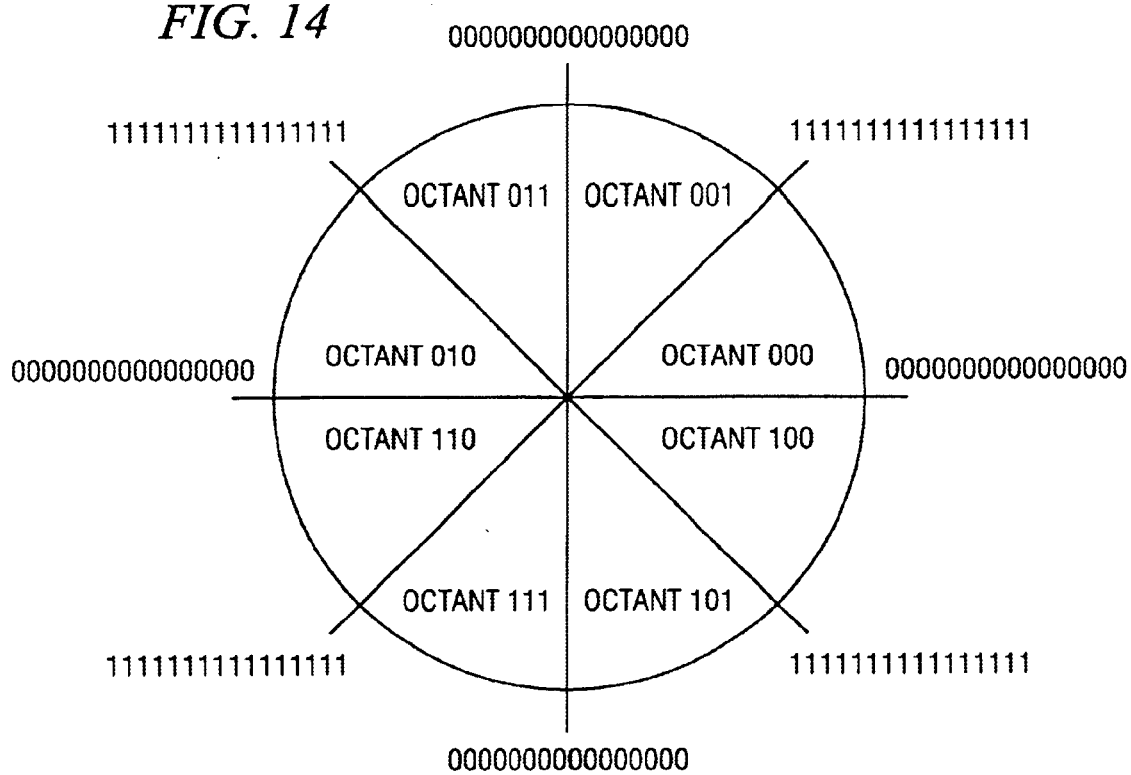
FIG. 14 illustrates the 8 octants of the phase diagram of the 8 states(clock signals) which are coded into the 3-bit octant code of the Phase interpolator 42 of FIG. 3.

There are 8 octants on the phase diagram of FIG. 14 and these are coded into the 8 states of the 3-bit octant code. The 8 codes were chosen as the sequence of a Gray-code counter so that as the phase moves from one octant to the next in either direction, only one bit of the code changes at a time. This simplifies the coding for the phase interpolator muxs 80(illustrated in FIG. 16) and also protects against an unstable EARLYB signal from the early/late voting block from being able to ever make the phase jump more than one or two phase steps. This is part of the protection designed to protect against metastability causing disruptive phase steps.

The 16-bit thermometer code 82 is also designed so that only one bit at a time should change from one phase step to the next. In this case, instead of the Grey-code pattern, a single next bit in the sequence changes from 0 to 1 or 1 to a 0 such that the code starts off with n '1's and then finishes with 16-n '0's. Examples of valid thermometer codes 82 are 1111111100000000 or 1111100000000000. Examples of invalid codes are 0000000000001111 or 1110111000000100. The first is invalid because it has the zeros before the ones while the second is invalid because it has ones after zeros.

Figure 15:
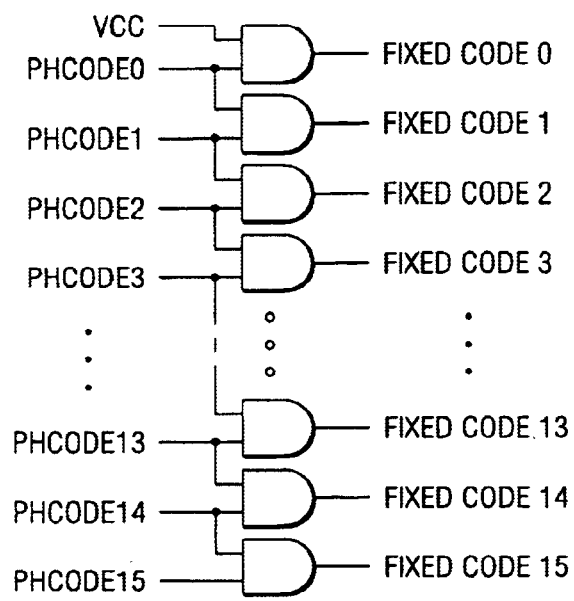
FIG. 15 illustrates, in more detail, the block of circuitry in FIG. 12 used to correct for invalid codes in the Phase interpolator 42 of FIG. 3.

There is block of circuitry in FIG. 12 to correct for invalid codes. This circuitry is shown in more detail in FIG. 15. Essentially, each bit of the code is ANDed with the bit preceding it in the code. If a one in the code is either a first bit of the code or follows a one bit in the code, then it is a valid code. If a one in the code is found to follow a zero, then that one is changed to a zero and then filtered out. In this way, if any invalid code, either from the initial power up states of the flip flops or due to circuit glitch or metastable EARLYB signal, is filtered out back to valid code.

Figure 13:
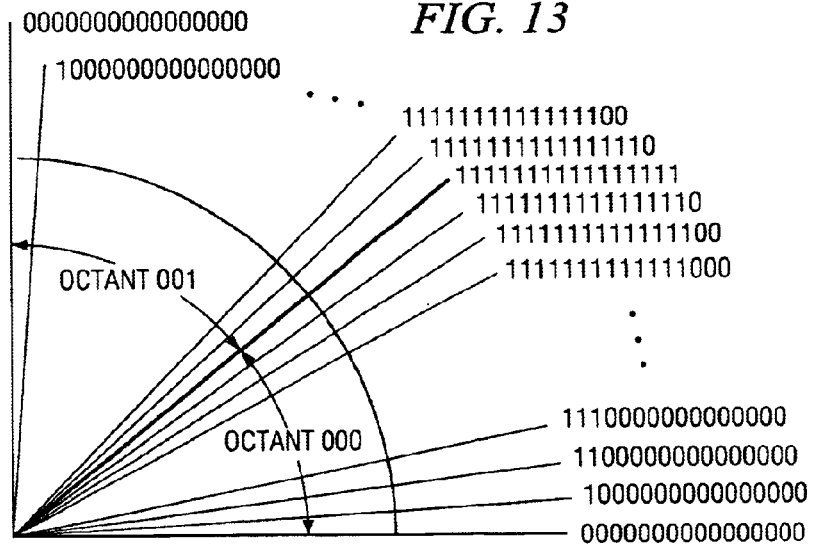
FIG. 13 illustrates the 16-bit thermometer code 82 distributed equally between two input clock signals of the Phase interpolator 44 of FIG. 3.
Figure 18:
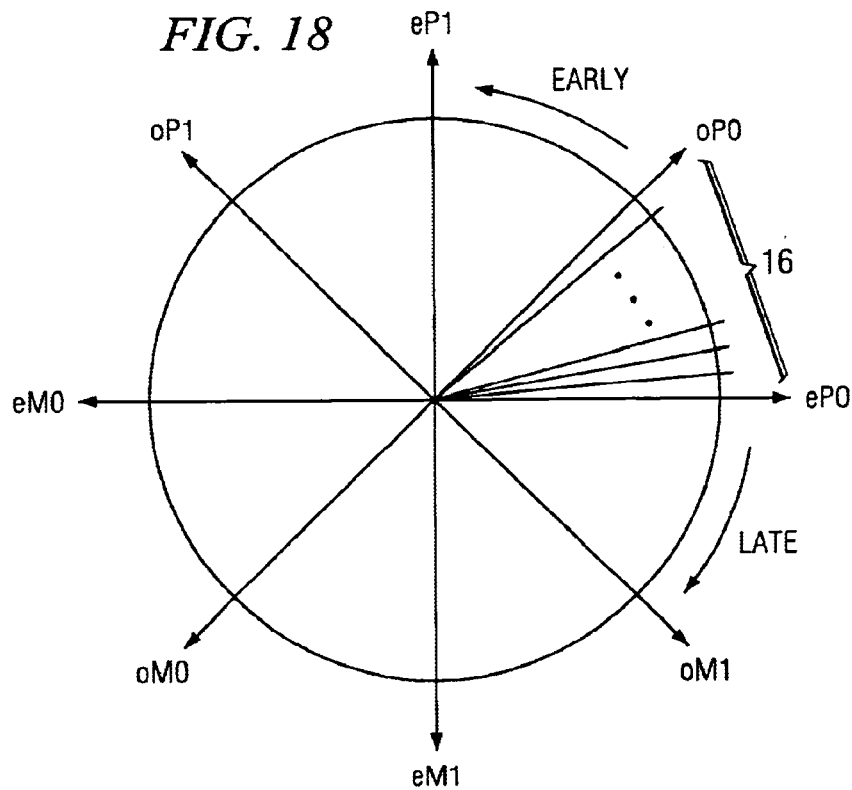
FIG. 18 illustrates the eight 45 degree phase shifted phases from the VCO 38 used for phase interpolation in the phase interpolator 44 of FIG. 3.
Figure 19:
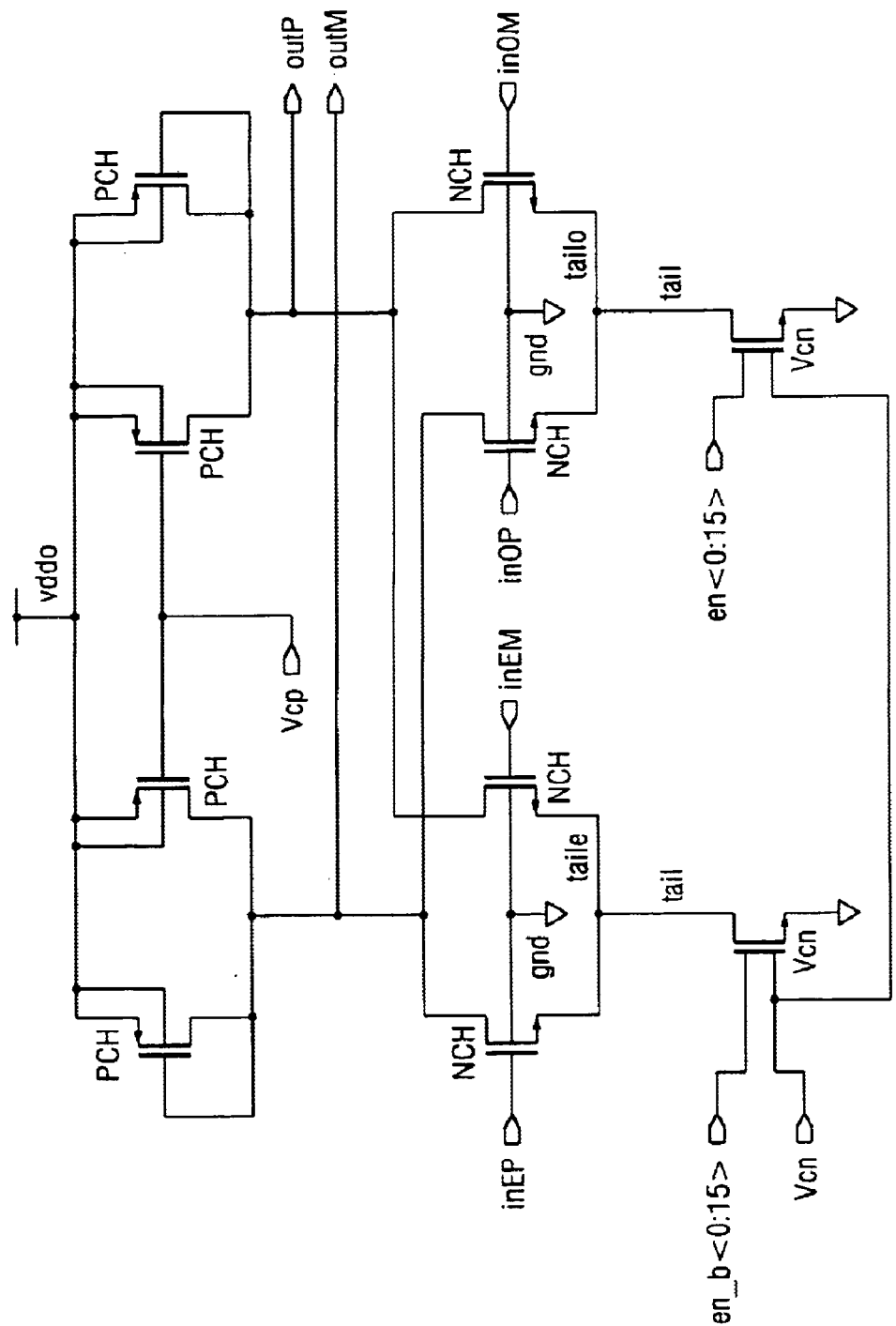
FIG. 19 illustrates a schematic of the phase interpolator 44 of FIGS. 16, 17 and 3.

The Phase Interpolator 44 illustrated in FIGS. 3, 16, 17, and 19 receives two input clocks with a phase difference of 45 degrees from the VCO 38 and generates an output clock whose phase is the weighted sum of the phases of the two input clocks. It is designed to have 16 phase steps per 45 degrees (64 phase steps per bit time) as illustrated in FIGS. 13 and 18. The thermometer code 82 that controls the digital weights is generated by the phase select logic 42. As shown in FIG. 4, the four stage VCO 38 (delay elements are differential) produces 8 clocks which are 45 degrees apart. The phase interpolator 44 takes two adjacent phases and interpolates them to one of the 16 phases based on the digital weights. Two clock phases are selected by the phase select logic 42 and then interpolated by the interpolator based on the thermometer code ic(0:15) and ic_b(0:15) 82, which are also generated by the phase select logic 42.

Figure 16:
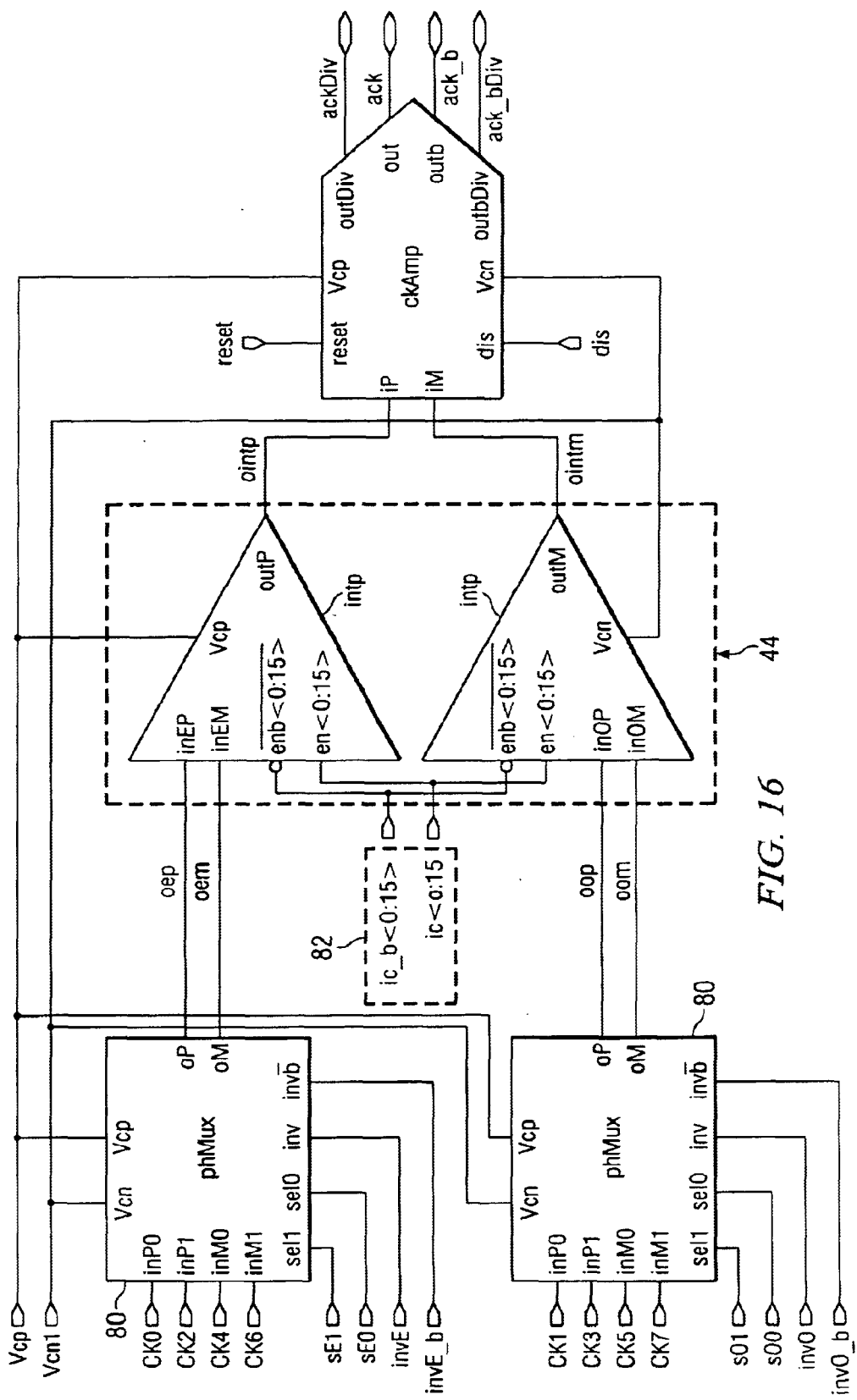
FIG. 16 illustrates a block diagram of the phase interpolator 44 and periphery circuits of FIG. 3.
Figure 17:
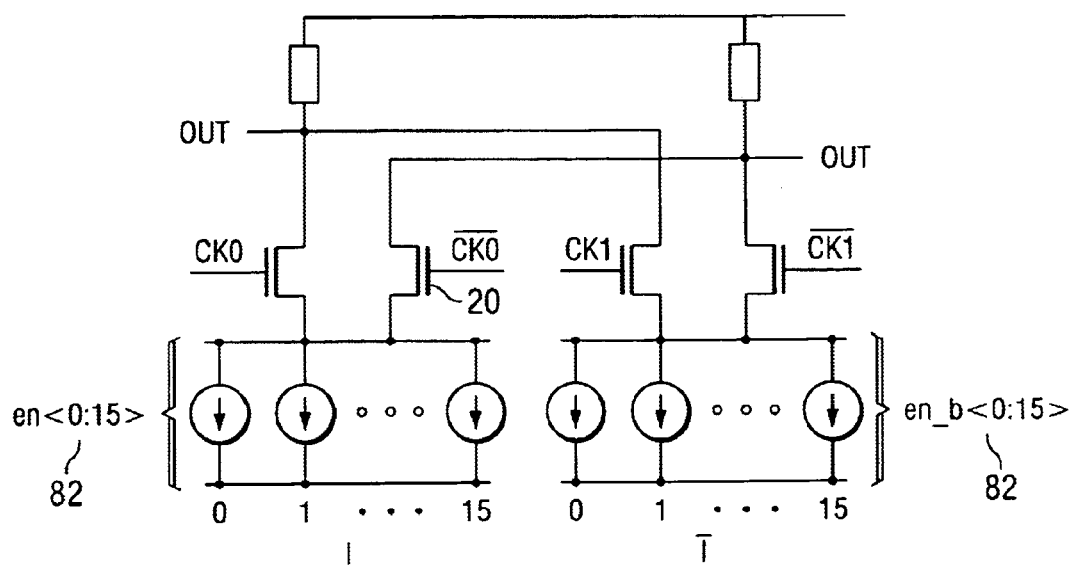
FIG. 17 illustrates a block diagram ofjust the phase interpolator 44 of FIG. 3 and FIG. 16.

As shown in FIG. 4, the four stage VCO 38(delay elements are differential) produces eight clock phases, ck0, ck1, ck2, ck3, ck4, ck5, ck6, ck7, which are each 45 degrees apart from one another. The interpolator takes two adjacent phases and interpolates them to one of the 16 phases based on the digital weight controlled by the thermometer code 82. As shown in FIG. 16, two MUXes 80 select two adjacent vectors for interpolation. Top PHMUX 80 selects one vector out of four (ck0, ck2, ck4 and ck6) and bottom PHMUx 80 selects one vector out of the four remaining vectors Since the signal path is differential, if ck0 is selected (as the positive signal of the differential ck4 is the negative signal of the differential signal and vice versa. Both PHMUX 80 are identical and each comprise two more identical multiplexers within each PHMUX 80. The first multiplexer within selects either ck0 or ck2 and the later selects either ck4 or ck5 by simply inverting the output of the first MUX. Phase select logic 42 generates control signals sE0, sE1, sO0, sO1, invE, invE_b, invO and invO_b, which determine which clock vectors are selected in such a way that only one vector is selected at one instance. For example, if the output clock phase is starting from 0 degrees and increasing (counter clockwise direction in FIG. 18), ck0 and ck1 are the two vectors selected. When through thermometer inputs demanding an increasing phase shift the output clock reaches 45 degrees, ck2 is selected instead of ck0 while ck1 is still selected. Similarly, when the output clock reaches 90 degrees, ck3 is selected instead of ck1 while ck2 is still selected. The two selected clock phases, oep and oop in FIG. 16 are interpolated by phase interpolator 44 based on the thermometer code ic(0:15) and ic_b(0:15) 82, which are generated by the phase select logic 42.

I claim:

1. A time division multiplex data recover system comprising:

a reference clock generator generating a reference clock signal;

a phase frequency comparator having a first input connected to said reference clock generator, a second input and an output generating a voltage proportional to a difference in phase and frequency between a signal received at said first input and a signal received at said second input;

a voltage controlled oscillator having a voltage input connected to said output of said phase frequency comparator and a plurality of clock signal outputs each generating a corresponding clock signal at differing phases, each having a frequency proportional to a voltage received at said voltage input, said plurality of clock signals including a sampling clock signal and a leading clock signal having a phase leading said sampling clock signal by 90°;

a data recovery block having an input receiving a time division multiplexed data signal, a first clock input receiving said sampling clock signal and a second clock input receiving said leading clock signal, said data recovery block deserializing the received time division multiplexed data signal by sampling with said sampling clock signal, said data recovery block further sampling the received time division multiplexed data signal with said leading clock signal and generating an early/late signal indicating whether said sampling clock signal is early or late by comparing a value of the received time division multiplexed data signal sampled with said sampling clock signal to a value of the received time division multiplexed data signal sampled with said leading clock signal;

a phase selection circuit connected to said data recovery block and receiving said early/late signal, said phase selection circuit generating an interpolation code indicative of an interpolation amount and a phase select code indicative of one phase sector of a plurality of phase sectors dependent upon said early/late signal, said one phase sector disposed between an adjacent pair of said plurality of clock signals;

a phase interpolator having a plurality of clock inputs receiving said plurality of clock signals at differing phases of said voltage controlled oscillator, an interpolation input receiving said interpolation code and a phase select input receiving said phase select code, and said phase interpolator generating a single output signal of an interpolation of said adjacent pair of said plurality of clock signals corresponding to said interpolation code and said phase select code, said single output signal connected to said second input of said phase frequency comparator.

2. The time division multiplex data recover system of claim 1, wherein:

said voltage controlled oscillator includes a ring oscillator having a plurality of differential input, differential output voltage controlled delay elements, said differential outputs of said voltage controlled delay elements forming said plural outputs of said voltage controlled oscillator.

* * * * *